(12) United States Patent
Chard et al.

(10) Patent No.: US 7,298,302 B1
(45) Date of Patent: Nov. 20, 2007

(54) SYSTEM AND METHOD FOR PRESENTING SERIAL DRIVE SIGNALS FOR EFFECTING COMMUNICATION OF A PLURALITY OF PARALLEL DATA SIGNALS

(75) Inventors: Gary Franklin Chard, Garland, TX (US); T-Pinn Ronnie Koh, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/437,396

(22) Filed: May 17, 2006

(51) Int. Cl.
*H03M 9/00* (2006.01)
(52) U.S. Cl. ........................ 341/101; 341/100
(58) Field of Classification Search ............... 341/100, 341/101
See application file for complete search history.

(56) References Cited

U.S. PATENT DOCUMENTS

| | | | | |
|---|---|---|---|---|
| 5,367,300 | A * | 11/1994 | Fong et al. | 341/101 |
| 5,951,669 | A * | 9/1999 | Bailey et al. | 710/260 |
| 6,184,808 | B1 * | 2/2001 | Nakamura | 341/95 |
| 6,684,275 | B1 * | 1/2004 | Goldstein | 710/71 |
| 6,839,783 | B2 * | 1/2005 | Samuel et al. | 710/107 |
| 7,215,263 | B2 * | 5/2007 | Dietrich et al. | 341/101 |
| 2004/0098517 | A1 * | 5/2004 | Goldstein | 710/1 |
| 2005/0219084 | A1 * | 10/2005 | Dietrich et al. | 341/101 |
| 2007/0024476 | A1 * | 2/2007 | Saeki et al. | 341/101 |
| 2007/0030184 | A1 * | 2/2007 | Nguyen et al. | 341/100 |
| 2007/0073981 | A1 * | 3/2007 | Im et al. | 711/149 |

* cited by examiner

*Primary Examiner*—Linh Nguyen
(74) *Attorney, Agent, or Firm*—Wade J. Brady, III; Frederick J. Telecky, Jr.

(57) ABSTRACT

A system for presenting serial drive signals for effecting communication of parallel data signals includes: a controller; a serializer coupled with the controller; and a tri-state logic device coupled with the serializer. The controller provides parallel logic state signals to the serializer. The serializer treats the parallel data signals to present a serial data signal representing the parallel data signals at a first output locus, and treats the parallel logic state signals to present a serial logic state signal representing the parallel logic state signals at a second output locus. The tri-state logic device receives the serial data signal and the serial logic state signal for logical evaluation. The tri-state logic device presents the serial drive signals at a third output locus. Each respective drive signal has a respective drive state. Each respective drive state is determined by the logical evaluation.

20 Claims, 3 Drawing Sheets

| | DATA | TRI-STATE CONTROL | SERIAL OUT | |
|---|---|---|---|---|
| 152 → | 0 | 0 | DRIVE 0 | 151 |
| 154 → | 1 | 0 | DRIVE 1 | |
| 156 → | X | 1 | Z | |
| | ↑ 160 | ↑ 162 | ↑ 164 | FIG. 3 |

SYSTEM AND METHOD FOR PRESENTING SERIAL DRIVE SIGNALS FOR EFFECTING COMMUNICATION OF A PLURALITY OF PARALLEL DATA SIGNALS

BACKGROUND OF THE INVENTION

The present invention is directed to input-output (IO) devices, and especially to serializer/deserializer (SERDES) devices. Analog SERDES modules operating at high speeds may experience a problem in controlling the tri-state output device of the SERDES module with sufficient accuracy to meet standards requirements that establish constraints more stringent than the slower clock period of digital control circuitry that controls the SERDES module. A solution to this problem in the past has been to operate the digital control circuitry of the SERDES module at a high speed in order to meet requirements.

There are disadvantages to such high speed operation of the digital control circuitry of the SERDES module including, by way of example and not by way of limitation, higher power consumption, increased difficulty in maintaining timing, more expensive parts for handling higher speed technology and more complex logic in the data path.

There is a need for a system and method for presenting serial drive signals for effecting communication of a plurality parallel data signals that permits operation of digital control circuitry at a speed less than the output speed of the module.

There is a need for a serializer/deserializer (SERDES) module that may operate control circuitry at a lower speed than the operational speed of output signals from the module.

SUMMARY OF THE INVENTION

A system for presenting serial drive signals for effecting communication of parallel data signals includes: a controller; a serializer coupled with the controller; and a tri-state logic device coupled with the serializer. The controller provides the parallel data signals and parallel logic state signals to the serializer. The serializer treats the parallel data signals to present a serial data signal representing the parallel data signals at a first output locus, and treats the parallel logic state signals to present a serial logic state signal representing the parallel logic state signals at a second output locus. The tri-state logic device receives the serial data signal and the serial logic state signal for logical evaluation. The tri-state logic device presents the serial drive signals at a third output locus. Each respective drive signal has a respective drive state. Each respective drive state is determined by the logical evaluation.

A method for presenting serial drive signals for effecting communication of a plurality of parallel data signals includes the steps of: (a) in no particular order: (1) providing a control unit; (2) providing a serializing unit coupled with the control unit; and (3) providing a tri-state logic device coupled with the serializing unit; (b) operating the control unit to provide the plurality of parallel data signals and to provide a plurality of parallel logic state signals to the serializing unit; (c) in no particular order: (1) operating the serializing unit to treat the plurality of parallel data signals to present a serial data signal at a first output locus; the serial data signal representing the plurality of parallel data signals; and (2) operating the serializing unit to treat the plurality of parallel logic state signals to present a serial logic state signal at a second output locus; the serial logic state signal representing the plurality of parallel logic state signals; (d) operating the tri-state logic device to receive the serial data signal and the serial logic state signal for logical evaluation; and (e) operating the tri-state logic device to present the serial drive signals at a third output locus. Each respective drive signal has a respective drive state of a plurality of drive states. Each respective drive state is determined by the logical evaluation.

It is therefore an object of the present invention to provide a system and method for presenting serial drive signals for effecting communication of a plurality parallel data signals that permits operation of digital control circuitry at a speed less than the output speed of the module.

By way of example and not by way of limitation, the present invention is representatively configured to provide a serializer/deserializer (SERDES) module that may operate control circuitry at a lower speed than the operational speed of output signals from the module.

Further objects and features of the present invention will be apparent from the following specification and claims when considered in connection with the accompanying drawings, in which like elements are labeled using like reference numerals in the various figures, illustrating the preferred embodiments of the invention.

BRIEF DESCRIPTION OF THE DRAWINGS

FIG. 3 is an illustration of a representative logic table for effecting logical evaluation by a tri-state device employed in the present invention.

DETAILED DESCRIPTION OF THE PREFERRED EMBODIMENT

Serializer/deserializer (SERDES) applications have increased recently to meet a demand for denser, higher-speed communications. By compressing numerous parallel data inputs into a serial data stream, SERDES modules facilitate data transfers in circuitry. SERDES modules are well-suited for effecting data transfers where circuit layout or other design considerations make provision of parallel data paths from point-to-point in a circuit impractical or undesirable. By way of example and not by way of limitation, SERDES circuitry may be advantageously employed in circuit paths traversing a flexible or exposed circuit juncture such as the hinge area connecting a flip cover and a main body of a mobile telephone, in circuit paths across a printed circuit board, or in other crowded or congested configurations where it is desirable to reduce the number of connecting structures between loci.

The term "locus" is intended herein to indicate a place, location, locality, locale, point, position, site, spot, volume, juncture, junction or other identifiable location-related zone in one or more dimensions. A locus in a physical apparatus may include, by way of example and not by way of limitation, a corner, intersection, curve, line, area, plane, volume or a portion of any of those features. A locus in an electrical apparatus may include, by way of example and not by way of limitation, a terminal, wire, circuit, circuit trace, circuit board, wiring board, pin, connector, component, collection of components, sub-component or other identifiable location-related area in one or more dimensions. A locus in a flow chart may include, by way of example and not by way of limitation, a juncture, step, site, function, query, response or other aspect, step, increment or an interstice between junctures, steps, sites, functions, queries, responses or other aspects of the flow or method represented by the chart.

SERDES modules may generate a differential output signal in order to enjoy benefits of such signaling such as, by way of example and not by way of limitation, LVDS (Low Voltage Differential Signal) signaling with its advantageous common-mode noise rejection characteristic. Other differential signaling output arrangements may be used such as, by way of further example and not by way of limitation, emitter-coupled logic (ECL) like LVPECL (Low-Voltage Positive Emitter-Coupled Logic). In the interest of simplicity of drawings and straightforwardness of explanation, only single-ended output arrangements are illustrated here. One skilled in the art of circuit design will recognize how the teachings of the present invention may be advantageously employed for differential signaling output arrangements.

Figure 1:
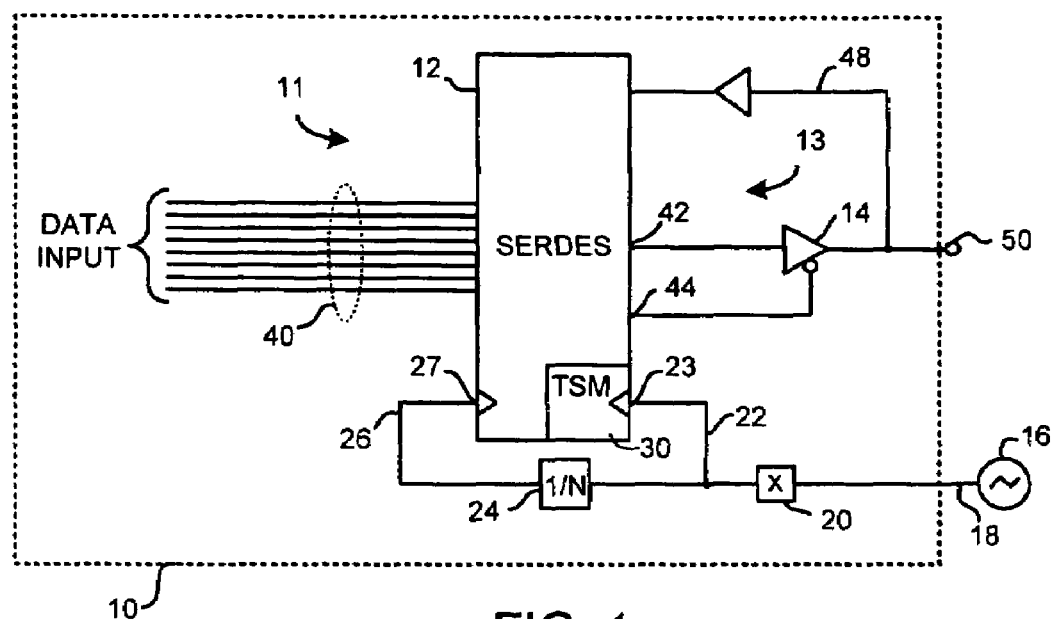
FIG. 1 is a schematic diagram illustrating a representative prior art SERDES (serializer/deserializer) module.

FIG. 1 is a schematic diagram illustrating a representative prior art SERDES (serializer/deserializer) module. In FIG. 1, a serializer/deserializer (SERDES) module 10 includes a SERDES unit 12 and a tri-state device 14. SERDES unit 12 has a low speed side 11 and a high-speed side 13. A timing source 16 provides a timing signal on a timing line 18. Timing source 16 may be embodied, by way of example and not by way of limitation, in a phase-locked loop (PLL) circuit. A multiplier 20 effects multiplication or speeding up of timing signals on line 18 to present high-speed clock signals to a high-speed clock input locus 23 at high-speed side 13 of SERDES unit 12 via a high-speed clock line 22. A divider 24 effects division or slowing down of timing signals from multiplier 20 to present low-speed clock signals to a low-speed clock input locus 27 at low-speed side 11 of SERDES unit 12 via a low-speed clock line 26.

SERDES unit 12 includes a control unit 30 at high-speed side 13. By way of example and not by way of limitation, control unit 30 is embodied in a Tristate control State Machine (TSM) in FIG. 1.

A plurality of low-speed parallel data lines 40 receive data input at low-speed side 11 of SERDES unit 12. SERDES unit 12 presents a serial data signal at a serial data output locus 42 at high-speed side 13 of SERDES unit 12. It is preferred that serial output signals presented at serial data output locus 42 faithfully represent parallel input data signals received from parallel data lines 40 at low-speed side 11. Division by a factor N is indicated in FIG. 1 to indicate that division of timing signals from multiplier 20 may be effected variously. Factor N is customarily related to the number of data lines 40 so that factor N may be established as N=8 for SERDES module 10. Factor N may be assigned integer values where, $$1 \leq N < \infty \quad [1]$$

Control unit 30 is coupled serially with high-speed clock input locus 23 and employs high-speed clock signals from high-speed clock input locus 23 to present a control signal at a control signal output locus 44 at high-speed side 13. Serial data signals are received by tri-state device 14 from serial data output locus 42. Tri-state device 14 also receives control signals from control signal output locus 44. Tri-state device 14 effects a logical evaluation of received serial data signals and control signals and presents drive signals at a signal locus 50. Tri-state device 14 may, by way of example and not by way of limitation, present a DRIVE 1 signal indicating a data element "1", a DRIVE 0 signal indicating a data element "0" or a Z signal. A Z signal may indicate a control operation from control unit 30 such as, by way of example and not by way of limitation, a mode in which SERDES unit 12 operates to receive signals from a remote device (not shown in FIG. 1) via signal locus 50 and a return path 48 to SERDES unit 12.

A significant shortcoming of SERDES module 10 is that assuring time-incidence of signals presented at signal locus 50 with input signals received via low-speed data lines 40 requires operating control unit 30 at a high speed approximating operational speeds extant at high-speed side 13 of SERDES unit 12. Such a high speed of operation is disadvantageous, as may be manifested in SERDES module 10, by way of example and not by way of limitation, by higher power consumption, by increased difficulty in maintaining timing, by requiring more expensive parts for effecting higher speed technology and by more complex logic in the data path within SERDES unit 12.

Figure 2:
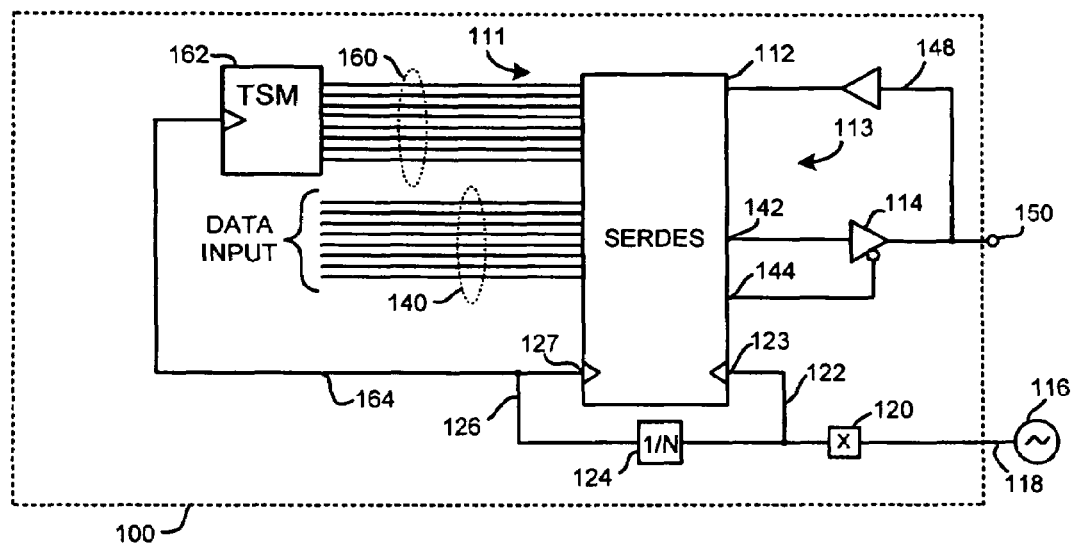
FIG. 2 is a schematic diagram illustrating a SERDES (serializer/deserializer) module configured according to the teaching of the present invention.

FIG. 2 is a schematic diagram illustrating a SERDES (serializer/deserializer) module configured according to the teaching of the present invention. In FIG. 2, a serializer/deserializer (SERDES) module 100 includes a SERDES unit 112 and a tri-state device 114. SERDES unit 112 has a low speed side 111 and a high-speed side 113. A timing source 116 provides a timing signal on a timing line 118. Timing source 116 may be embodied, by way of example and not by way of limitation, in a phase-locked loop (PLL) circuit. A multiplier 120 effects multiplication or speeding up of timing signals on line 118 to present high-speed clock signals to a high-speed clock input locus 123 at high-speed side 113 of SERDES unit 112 via a high-speed clock line 122. A divider 124 effects division or slowing down of timing signals from multiplier 120 to present low-speed clock signals to a low-speed clock input locus 127 at low-speed side 111 of SERDES unit 112 via a low-speed clock line 126.

A plurality of low-speed parallel data lines 140 receive data input at low-speed side 111 of SERDES unit 112. SERDES unit 112 presents a serial data signal at a serial data output locus 142 at high-speed side 113 of SERDES unit 112. It is preferred that serial output signals presented at serial data output locus 142 faithfully represent parallel input data signals received from parallel data lines 140 at low-speed side 111. Division by a factor N is indicated in FIG. 2 to indicate that division of timing signals from multiplier 120 may be effected variously. Factor N is customarily related to the number of data lines 140 so that factor N may be established as N=8 for SERDES module 100. Factor N may be assigned integer values according to expression [1] above.

SERDES unit 112 responds to a state machine 162. By way of example and not by way of limitation, state machine 162 is embodied in a Tristate control State Machine (TSM) in FIG. 2. State machine 162 provides a plurality of parallel control signal lines 160 to provide a control input at low-speed side 111 of SERDES unit 112. The number of parallel control signal lines 160 is related to the number of data lines 140, preferably according to the relationship, $$\frac{N}{M} \quad [2]$$

Factor N is established according to expression [1], and factor M is an integer. A preferred embodiment of SERDES module 100 establishes factor M=1, so that the number of data lines 140 is equal with the number of control signal lines 160.

State machine 162 is coupled with divider 124 in parallel with SERDES unit 112 so that low-speed clock line 126 also provides a low-speed clock signal to state machine 162 via a low-speed clock line 164. As a result, state machine 162 and low-speed side 111 of SERDES unit 112 are driven by the same low speed clock signal. As a consequence, state machine 162 and low-speed side 111 of SERDES unit 112 are assured to operate synchronously.

State machine 162 is controlled by a control unit 130. By way of example and not by way of limitation, control unit 130 is embodied in a digital microprocessor in FIG. 2.

SERDES unit 112 receives data signals via low-speed parallel data lines 140 and presents a serial data signal at a serial data output locus 142 at high-speed side 113 of SERDES unit 112. It is preferred that serial output signals presented at serial data output locus 142 faithfully represent parallel input data signals received from parallel data lines 140 at low-speed side 111. Control unit 130 operates to cause state machine 162 to present control information via control signal lines 160 appropriately to present a control signal at a control signal output locus 144 at high-speed side 113. Serial data signals are received by tri-state device 114 from serial data output locus 142. Tri-state device 114 also receives control signals from control signal output locus 144. Tri-state device 114 effects a logical evaluation of received serial data signals and control signals and presents drive signals at a signal locus 150. A representative logical evaluation table appropriate for use by tri-state device 114 is described in connection with FIG. 3. Tri-state device 114 may, by way of example and not by way of limitation, present a "DRIVE 1" signal indicating a data element "1", a "DRIVE 0" signal indicating a data element "0" or a "Z" signal. A Z signal may indicate a control operation from control unit 130 such as, by way of example and not by way of limitation, a mode in which SERDES unit 112 operates to receive signals from a remote device (not shown in FIG. 2) via signal locus 150 and a return path 148 to SERDES unit 112.

An important feature of SERDES module 100 is that control unit 130 generates low-speed control signals via control signal lines 160 at low-speed side 111 of SERDES unit 112. Control signals on control signal lines 160 and data signals on data lines 140 are treated simultaneously by SERDES unit 112 using the same high-speed clock signals received at high-speed clock input locus 123 from high-speed clock line 122. That is, data signals (received via data lines 140) and control signals (received via control signal lines 160) are treated by SERDES unit 112 in lock-step using a common clocking signal (high-speed clock signals from high-speed clock locus 123). As a result, serialized data signals presented at serial data output locus 142 representing data received from data lines 140 are in synchrony with serialized control signals presented at control signal output locus 144 representing control signals received from control signal lines 160. Of importance is the result that control unit 130 is configured to effect generation of control signals for conveyance via control signal lines 160 at a low speed. It is not necessary to operate a control unit (e.g., control unit 30; FIG. 1) generate control signals at high speed as was required in SERDES module 10 (FIG. 1).

Synchrony of data signals at serial data output locus 142 and control signal output locus 144 is assured in SERDES module 100 (FIG. 2), thereby assuring time-incidence of signals presented at signal locus 150 with input signals received via low-speed data lines 140 without operating control unit 130 at a high speed. Such low-speed of operation of control unit 130 contributes to avoiding disadvantages such as, by way of example and not by way of limitation, high power consumption, difficulty in maintaining timing, expensive parts for effecting higher speed technology and complex logic in the data path within SERDES unit 112.

FIG. 3 is an illustration of a representative logic table for effecting logical evaluation by a tri-state device employed in the present invention. In FIG. 3, a representative logical evaluation table 151 for use by SERDES module 100 (FIG. 2) includes data rows 152, 154, 156 arranged in data columns 160, 162, 164. Column 160 contains data presented at serial data output locus 142 (FIG. 2). Column 162 contains data presented at control signal output locus 144 (FIG. 2). Column 164 contains data presented at signal locus 150 (FIG. 2).

As indicated by row 152, when data presented at serial data output locus 142 is a "0" and data presented at control signal output locus 144 is "0", then data presented at signal locus 150 is a "DRIVE 0" signal. As indicated by row 154, when data presented at serial data output locus 142 is a "1" and data presented at control signal output locus 144 is "0", then data presented at signal locus 150 is a "DRIVE 1" signal. As indicated by row 156, when data presented at serial data output locus 142 is any value (represented by "X" in FIG. 3) and data presented at control signal output locus 144 is "1", then data presented at signal locus 150 is a "Z" signal. Other logical relationships among data presented at loci 142, 144, 150 may be established to satisfy various operational requirements as desired, as will be understood by one skilled in the art of circuit design.

Figure 4:
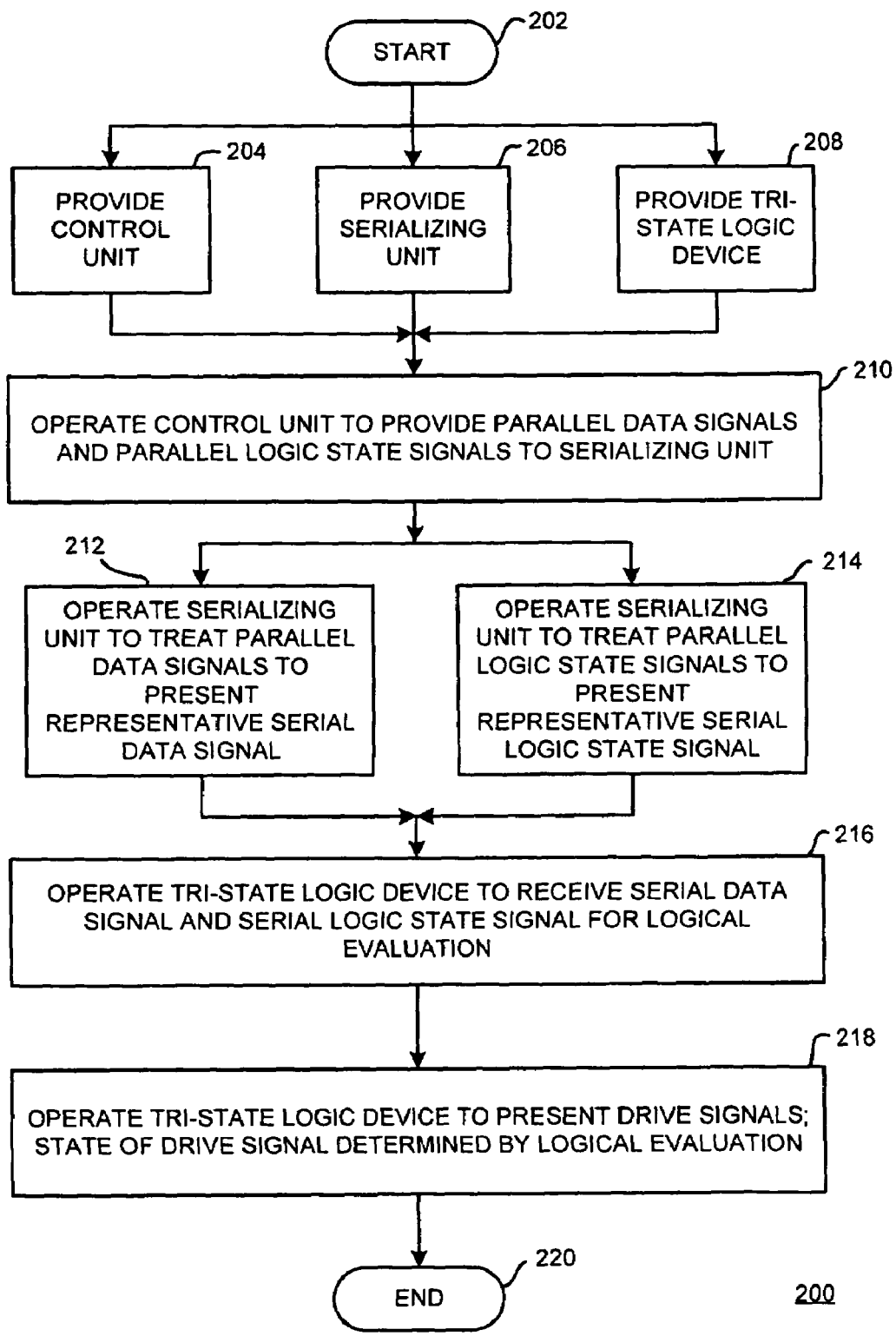
FIG. 4 is a flow chart illustrating the method of the present invention.

FIG. 4 is a flow chart illustrating the method of the present invention. In FIG. 4, a method 200 for presenting serial drive signals for effecting communication of a plurality of parallel data signals begins at a START locus 202. Method 200 continues by, in no particular order: (1) Providing a control unit, as indicated by a block 204. (2) Providing a serializing unit coupled with the control unit, as indicated by a block 206. (3) Providing a tri-state logic device coupled with the serializing unit, as indicated by a block 208.

Method 200 continues by operating the control unit to provide the plurality of parallel data signals and to provide a plurality of parallel logic state signals to the serializing unit, as indicated by a block 210.

Method 200 continues by, in no particular order: (1) Operating the serializing unit to treat the plurality of parallel data signals to present a serial data signal at a first output locus, as indicated by a block 212. The serial data signal represents the plurality of parallel data signals. (2) Operating the serializing unit to treat the plurality of parallel logic state signals to present a serial logic state signal at a second output locus, as indicated by a block 214. The serial logic state signal represents the plurality of parallel logic state signals.

Method 200 continues by operating the tri-state logic device to receive the serial data signal and the serial logic state signal for logical evaluation, as indicated by a block 216.

Method 200 continues by operating the tri-state logic device to present the serial drive signals at a third output locus, as indicated by a block 218. Each respective drive signal has a respective drive state of a plurality of drive states. Each respective drive state is determined by the logical evaluation.

Method 200 terminates at an END locus 200.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following

We claim:

1. A system for presenting serial drive signals for effecting communication of a plurality of parallel data signals; the system comprising:
   (a) a control unit;
   (b) a serializing unit coupled with said control unit; and
   (c) a tri-state logic device coupled with said serializing unit;
   said control unit providing said plurality of parallel data signals and providing a plurality of parallel logic state signals to said serializing unit; said serializing unit treating said plurality of parallel data signals to present a serial data signal at a first output locus; said serial data signal representing said plurality of parallel data signals; said serializing unit treating said plurality of parallel logic state signals to present a serial logic state signal at a second output locus; said serial logic state signal representing said plurality of parallel logic state signals; said tri-state logic device receiving said serial data signal and said serial logic state signal for logical evaluation; said tri-state logic device presenting said serial drive signals at a third output locus; each respective said drive signal having a respective drive state of a plurality of drive states; each said respective drive state being determined by said logical evaluation.

2. A system for presenting serial drive signals for effecting communication of a plurality of parallel data signals as recited in claim 1 wherein said control unit operates at a first operating speed and wherein said tri-state logic device receives said serial data signal and said serial logic state signal at a second operating speed; said first operating speed being slower than said second operating speed.

3. A system for presenting serial drive signals for effecting communication of a plurality of parallel data signals as recited in claim 1 wherein said serializing unit treating of said plurality of parallel data signals is effected using a first clock signal and wherein said serializing unit treating of said plurality of parallel logic state signals is effected using a second clock signal.

4. A system for presenting serial drive signals for effecting communication of a plurality of parallel data signals as recited in claim 3 wherein said first clock signal and said second clock signal are each derived from a common original clock signal.

5. A system for presenting serial drive signals for effecting communication of a plurality of parallel data signals as recited in claim 1 wherein said serializing unit treating of said plurality of parallel data signals and said serializing unit treating of said plurality of parallel logic state signals are effected using the same clock signal.

6. A system for presenting serial drive signals for effecting communication of a plurality of parallel data signals as recited in claim 2 wherein said serializing unit treating of said plurality of parallel data signals is effected using a first clock signal and wherein said serializing unit treating of said plurality of parallel logic state signals is effected using a second clock signal.

7. A system for presenting serial drive signals for effecting communication of a plurality of parallel data signals as recited in claim 6 wherein said first clock signal and said second clock signal are each derived from a common original clock signal.

8. A system for presenting serial drive signals for effecting communication of a plurality of parallel data signals as recited in claim 2 wherein said serializing unit treating of said plurality of parallel data signals is effected and said serializing unit treating of said plurality of parallel logic state signals are effected using the same clock signal.

9. A system for effecting communication of data according to a communication scheme;
   the system comprising:
   (a) a state machine unit operating at a first operating speed; said state machine presenting a plurality of parallel data signals at a first signal speed and presenting a plurality of parallel logic state signals at said first signal speed;
   (b) a serializing unit coupled with said state machine unit for receiving said plurality of parallel data signals and receiving said plurality of parallel logic state signals; said serializing unit treating said plurality of parallel data signals to present a serial data signal at a first signal locus at a second signal speed and treating said plurality of parallel logic state signals to present a serial logic state signal at a second signal locus at said second signal speed; and
   (c) A tri-state logic device coupled with said serializing unit for receiving said serial data signal and said serial logic state signal; said tri-state logic device presenting serial drive signals for effecting said communication scheme; each respective said drive signal having a respective drive state of a plurality of drive states; each said respective drive state being determined by logical evaluation of said serial digital signal and said serial logic state signal.

10. A system for effecting communication of data according to a communication scheme as recited in claim 9 wherein said first signal speed is slower than said second signal speed.

11. A system for effecting communication of data according to a communication scheme as recited in claim 9 wherein said serializing unit treating of said plurality of parallel data signals is effected using a first clock signal and wherein said serializing unit treating of said plurality of parallel logic state signals is effected using a second clock signal.

12. A system for effecting communication of data according to a communication scheme as recited in claim 11 wherein said first clock signal and said second clock signal are each derived from a common original clock signal.

13. A system for effecting communication of data according to a communication scheme as recited in claim 9 wherein said serializing unit treating of said plurality of parallel data signals and said serializing unit treating of said plurality of parallel logic state signals are effected using the same clock signal.

14. A system for effecting communication of data according to a communication scheme as recited in claim 10 wherein said serializing unit treating of said plurality of parallel data signals is effected using a first clock signal and wherein said serializing unit treating of said plurality of parallel logic state signals is effected using a second clock signal.

15. A system for effecting communication of data according to a communication scheme as recited in claim 14 wherein said first clock signal and said second clock signal are each derived from a common original clock signal.

16. A system for effecting communication of data according to a communication scheme as recited in claim 15 wherein said serializing unit treating of said plurality of parallel data signals and said serializing unit treating of said plurality of parallel logic state signals are effected using the same clock signal.

17. A method for presenting serial drive signals for effecting communication of a plurality of parallel data signals; the method comprising the steps of:
(a) in no particular order:
(1) providing a control unit;
(2) providing a serializing unit coupled with said control unit; and
(3) providing a tri-state logic device coupled with said serializing unit;
(b) operating said control unit to provide said plurality of parallel data signals and to provide a plurality of parallel logic state signals to said serializing unit;
(c) in no particular order:
(1) operating said serializing unit to treat said plurality of parallel data signals to present a serial data signal at a first output locus; said serial data signal representing said plurality of parallel data signals; and
(2) operating said serializing unit to treat said plurality of parallel logic state signals to present a serial logic state signal at a second output locus; said serial logic state signal representing said plurality of parallel logic state signals;
(d) operating said tri-state logic device to receive said serial data signal and said serial logic state signal for logical evaluation; and
(e) operating said tri-state logic device to present said serial drive signals at a third output locus; each respective said drive signal having a respective drive state of a plurality of drive states; each said respective drive state being determined by said logical evaluation.

18. A method for presenting serial drive signals for effecting communication of a plurality of parallel data signals as recited in claim 17 wherein said control unit operates at a first operating speed and wherein said tri-state logic device receives said serial data signal and said serial logic state signal at a second operating speed; said first operating speed being slower than said second operating speed.

19. A method for presenting serial drive signals for effecting communication of a plurality of parallel data signals as recited in claim 18 wherein said serializing unit treating of said plurality of parallel data signals is effected using a first clock signal and wherein said serializing unit treating of said plurality of parallel logic state signals is effected using a second clock signal; said first clock signal and said second clock signal each being derived from a common original clock signal.

20. A method for presenting serial drive signals for effecting communication of a plurality of parallel data signals as recited in claim 18 wherein said serializing unit treating of said plurality of parallel data signals is effected and said serializing unit treating of said plurality of parallel logic state signals are effected using the sane clock signal.

* * * * *